(12) United States Patent
Seol et al.

(10) Patent No.: US 8,400,818 B2
(45) Date of Patent: Mar. 19, 2013

(54) VOLTAGE-CONTROLLED OSCILLATOR AND PHASE-LOCKED LOOP CIRCUIT

(75) Inventors: Ho-Seok Seol, Daegu (KR); Seung-Jun Bae, Hwaseong-si (KR); Sang-Hyup Kwak, Seoul (KR)

(73) Assignee: Samsung Electronics Co., Ltd. (KR)

( * ) Notice: Subject to any disclaimer, the term of this patent is extended or adjusted under 35 U.S.C. 154(b) by 139 days.

(21) Appl. No.: 13/109,157

(22) Filed: May 17, 2011

(65) Prior Publication Data

US 2011/0310659 A1 Dec. 22, 2011

Related U.S. Application Data

(60) Provisional application No. 61/355,346, filed on Jun. 16, 2010.

(30) Foreign Application Priority Data

Sep. 13, 2010 (KR) ........................ 10-2010-0089377

(51) Int. Cl.
*G11C 7/00* (2006.01)
(52) U.S. Cl. ............................ 365/149; 327/105; 331/57
(58) Field of Classification Search .................. 365/149; 331/57; 327/105
See application file for complete search history.

(56) References Cited

U.S. PATENT DOCUMENTS

| 6,680,655 | B2 | 1/2004 | Rogers | |
|---|---|---|---|---|
| 2007/0013455 | A1* | 1/2007 | Roubadia et al. | 331/57 |
| 2008/0238495 | A1* | 10/2008 | Tachibana et al. | 327/105 |

FOREIGN PATENT DOCUMENTS

| JP | 2007189591 | 7/2007 |
|---|---|---|
| KR | 100872278 | 11/2008 |

* cited by examiner

*Primary Examiner* — Son Dinh
(74) *Attorney, Agent, or Firm* — Onello & Mello, LLP

(57) ABSTRACT

A voltage-controlled oscillator includes an oscillating unit configured to output first and second output clock signals at first and second nodes, respectively, the first and second output clock signals having a frequency that is variable in response to a control voltage. An active element unit connected to the oscillating unit is configured to maintain oscillation of the oscillating unit. A bias current generating unit connected to the active element unit at a bias node provides a bias current to the bias node and is adapted to adjust the bias current in response to a control code. First and second capacitor blocks connected to the oscillating unit and the active element unit provide first and second load capacitances, respectively, to the first and second nodes, respectively, in response to the control code.

20 Claims, 7 Drawing Sheets

VOLTAGE-CONTROLLED OSCILLATOR AND PHASE-LOCKED LOOP CIRCUIT

CROSS-REFERENCE TO RELATED APPLICATION(S)

This US non-provisional application claims the benefit of priority under 35 USC §119 to U.S. Provisional Application No. 61/355,346 filed on Jun. 16, 2010 in the USPTO, and Korean Patent Application No. 10-2010-0089377 filed on Sep. 13, 2010 in the Korean Intellectual Property Office (KIPO), the contents of which applications are herein incorporated by reference in their entirety.

BACKGROUND

1. Technical Field

Exemplary embodiments relate to semiconductor devices, and more particularly to a voltage-controlled oscillator and a phase-locked loop circuit which may include the voltage-controlled oscillator.

2. Description of the Related Art

Phase-locked loop (PLL) circuits are commonly included in semiconductor memory devices for generating clock signals. A PLL circuit typically includes a voltage-controlled oscillator (VCO). The VCO may generate an oscillating signal having a desired frequency in response to a voltage control signal. When the voltage control signal changes linearly, the frequency of the oscillating signal also changes linearly. Semiconductor memory devices now use lower power supply voltages. Accordingly, to accommodate the lower power supply voltage, the current consumption in the VCO must be reduced.

SUMMARY

Accordingly, the inventive concept is provided to substantially obviate one or more problems due to limitations and disadvantages of the related art.

According to one aspect, the inventive concept is directed to a voltage-controlled oscillator (VCO), which includes an oscillating unit, an active element unit, a bias current generating unit and first and second capacitor blocks. The oscillating unit outputs first and second output clock signals at first and second nodes, respectively, the first and second output clock signals having a frequency that is variable in response to a control voltage. The active element unit is connected to the oscillating unit and is configured to maintain oscillation of the oscillating unit. The bias current generating unit is connected to the active element unit at a bias node and provides a bias current to the bias node and is adapted to adjust the bias current in response to a control code. The first and second capacitor blocks are connected to the oscillating unit and the active element unit and provide first and second load capacitances, respectively, to the first and second nodes, respectively, in response to the control code.

In some exemplary embodiments, the first capacitor block may include a plurality of first capacitors connected in parallel to a power supply voltage VDD and a plurality of first p-type metal-oxide semiconductor (PMOS) transistors connected respectively between the first capacitors and the first node. The second capacitor block may include a plurality of second capacitors connected in parallel to the power supply voltage VDD and a plurality of second PMOS transistors connected respectively between the second capacitors and the second node.

In some exemplary embodiments, bits of the control code are applied respectively to gates of the first PMOS transistors and gates of the second PMOS transistors.

In some exemplary embodiments, the first and second load capacitances may be substantially the same.

In some exemplary embodiments, the frequencies of the first and second output clock signals may be coarsely tuned based on the first and second load capacitances determined by the control code, and the frequencies of the first and second output clock signals may be finely tuned in response to the control voltage.

In some exemplary embodiments, the bias current generating unit may include a first reference current generating unit which generates a first reference current, a second reference current generating unit which generates a second reference current having a magnitude which is the same as or n times as great as the magnitude of the first reference current, in response to the control code, where n may be a natural number equal to or greater than two, and a bias current providing unit which provides the bias node with the bias current, the bias current having a same magnitude as the second reference current.

In some exemplary embodiments, the second reference current generating unit may include a plurality of first PMOS transistors, each being connected to a power supply voltage, and a plurality of second PMOS transistors, each being connected between respective first PMOS transistors and a first node.

In some exemplary embodiments, bits of the control code may be applied to respective gates of the first PMOS transistors, and each of the second PMOS transistors may selectively provide the first node with a current having a same magnitude as the first reference current based on whether each of the first PMOS transistors is conducting, in response to the bits of the control code.

In some exemplary embodiments, the bias current generating unit may include a first PMOS transistor connected between the first node and a ground voltage through which the second reference current flows, and a second PMOS transistor connected between the bias node and the ground voltage which forms a current mirror with the first PMOS transistor.

In some exemplary embodiments, the bias current generating unit may include a reference current generating unit which generates the reference current and a bias current providing unit which provides the bias node with the bias current having a magnitude which is the same as or n times as great as the magnitude of the reference current in response to an inverted control code. The inverted control code may be an inverted version of the control code, and n may be a natural number equal to or greater than two.

In some exemplary embodiments, the reference current generating unit may include a current source connected to a power supply voltage which generates the reference current, a first n-type MOS (NMOS) transistor connected to the power supply voltage and a second NMOS transistor connected to the first NMOS transistor and a ground voltage. The first NMOS transistor may have a gate connected to the current source, and the second NMOS transistor may have a gate connected to the power supply voltage.

In some exemplary embodiments, the bias current generating unit may include a plurality of first NMOS transistors and a third NMOS transistor each connected to the bias node in parallel and a plurality of second NMOS transistors and a fourth NMOS transistor connected between the first NMOS transistors and the third NMOS transistor, respectively, and the ground voltage.

In some exemplary embodiments, each gate of the first NMOS transistors and the third NMOS transistor may be connected to the current source, each bit of the inverted control code may be applied to a gate of the second NMOS transistors, and a gate of the fourth NMOS transistor may be connected to the power supply voltage.

In some exemplary embodiments, the bias current generating unit may include an inverted control code generating unit which provides a bias voltage based on a reference current and generates an inverted control code in response to the control code, and a bias current providing unit which provides the bias node with the bias current having a magnitude which is the same as or n times as great as the magnitude of the reference current in response to the inverted control code, wherein n may be a natural number equal to or greater than two.

In some exemplary embodiments, the inverted control code generating unit may include a current source connected to a power supply voltage, which generates the reference current and provides the bias voltage due to the reference current, a first NMOS transistor which is connected to the current source and a ground voltage, and a plurality of inverters connected in parallel to a connection node connected to the current source and a gate of the first NMOS transistor, each of the inverters including one of a plurality of PMOS transistors and one of a plurality of first NMOS transistors, and each of the inverters generating one bit of the inverted control code in response to a respective bit of the control code.

In some exemplary embodiments, the bias current providing unit may include a second NMOS transistor and an additional plurality of second NMOS transistors connected in parallel between the bias node and the ground voltage. The bias voltage may be applied to a gate of the second NMOS transistor, and bits of the inverted control code may be applied to gates of the second NMOS transistors.

In some exemplary embodiments, each bit of the inverted control code may have a level of the bias voltage or the ground voltage in response to the control code.

According to another aspect, the inventive concept is directed to a phase-locked loop (PLL) circuit which includes a phase detector, a charge pump, a loop filter, a voltage-controlled oscillator (VCO) and a divider. The phase detector detects a phase difference between an input clock signal and a feedback clock signal to generate an up signal and a down signal. The charge pump controls a level of an output voltage in response to the up signal and the down signal. The loop filter low-pass filters the output voltage to generate a control voltage. The VCO adaptively adjusts a frequency of an output clock signal in response to the control voltage and a control code. The divider divides the frequency of the output clock signal to provide the feedback clock signal. The VCO includes an oscillating unit, an active element unit, a bias current generating unit and first and second capacitor blocks. The oscillating unit outputs first and second output clock signals at first and second nodes, respectively, the first and second output clock signals having a frequency that is variable in response to the control voltage. The active element unit is connected to the oscillating unit and is configured to maintain oscillation of the oscillating unit. The bias current generating unit is connected to the active element unit at a bias node and provides a bias current to the bias node and is adapted to adjust the bias current in response to the control code. The first and second capacitor blocks are connected to the oscillating unit and the active element unit and provide first and second load capacitances, respectively, to the first and second nodes, respectively, in response to the control code.

In some exemplary embodiments, the VCO may coarsely tune the frequency of the output clock signals in response to the control code, and may finely tune the frequency of the output clock signal in response to the control voltage.

According to another aspect, the inventive concept is directed to a semiconductor memory device, comprising a phase-locked loop having a voltage-controlled oscillator (VCO) and a data output buffer. The VCO comprises: an oscillating unit configured to output first and second output clock signals at first and second nodes, respectively, the first and second output clock signals having a frequency that is variable in response to the control voltage, an active element unit connected to the oscillating unit, the active element unit being configured to maintain oscillation of the oscillating unit, a bias current generating unit connected to the active element unit at a bias node, the bias current generating unit providing a bias current to the bias node and being adapted to adjust the bias current in response to a control code, and first and second capacitor blocks connected to the oscillating unit and the active element unit, the first and second capacitor blocks providing first and second load capacitances, respectively, to the first and second nodes, respectively, in response to the control code. The data output buffer temporarily stores data in response to the first and second output clock signals.

In some exemplary embodiments, the semiconductor memory device is a DDR SDRAM.

In some exemplary embodiments, the semiconductor memory device is a GDDR SDRAM.

In some exemplary embodiments, the bias current generating unit comprises: a reference current generating unit which generates the reference current; and a bias current providing unit which provides the bias node with the bias current, the bias current having a magnitude which is the same as or n times as great as the magnitude of the reference current in response to an inverted control code, the inverted control code being an inverted version of the control code, wherein n is a natural number equal to or greater than two.

In some exemplary embodiments, the first capacitor block comprises: a plurality of first capacitors connected in parallel to a power supply voltage VDD; and a plurality of first p-type metal-oxide semiconductor (PMOS) transistors connected respectively between the first capacitors and the first node, and wherein the second capacitor block comprises: a plurality of second capacitors connected in parallel to the power supply voltage VDD; and a plurality of second PMOS transistors connected respectively between the second capacitors and the second node.

The VCO and PLL circuit may reduce current consumption by adaptively adjusting bias current according to the frequency of the output clock signal.

BRIEF DESCRIPTION OF THE DRAWINGS

The foregoing and other features and advantages of the invention will be apparent from the more particular description of preferred aspects of the invention, as illustrated in the accompanying drawings, in which like reference characters refer to the same parts throughout the different views. The drawings are not necessarily to scale, emphasis instead being placed upon illustrating the principles of the invention.

DETAILED DESCRIPTION OF THE EMBODIMENTS

Figure 1:
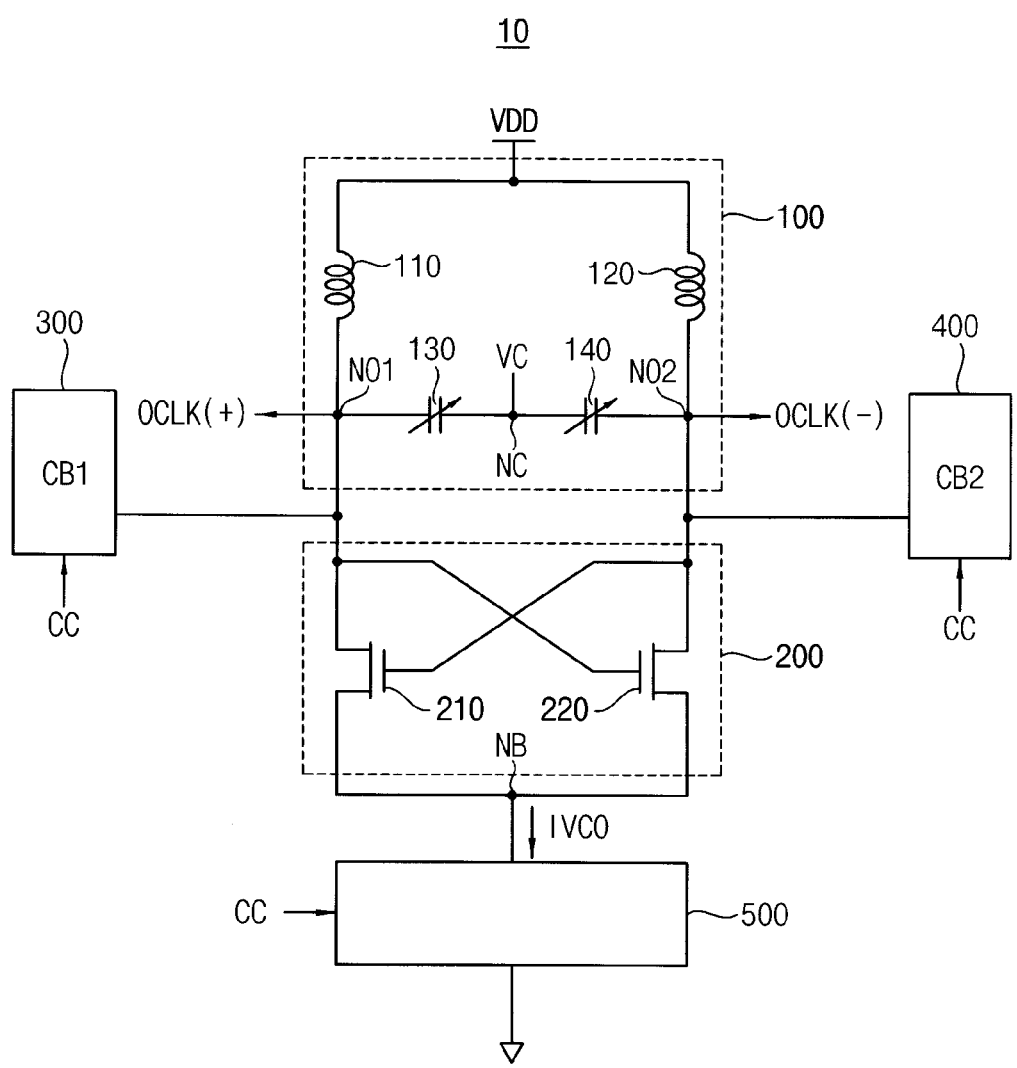
FIG. 1 is a schematic block diagram illustrating a voltage-controlled oscillator (VCO), according to some exemplary embodiments.

Various exemplary embodiments will be described more fully hereinafter with reference to the accompanying drawings, in which some exemplary embodiments are shown. The present inventive concept may, however, be embodied in many different forms and should not be construed as limited to the exemplary embodiments set forth herein. Rather, these exemplary embodiments are provided so that this description will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third, etc., may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic block diagram illustrating a voltage-controlled oscillator (VCO) according to some exemplary embodiments.

Referring to FIG. 1, the VCO 10 of these exemplary embodiments includes an oscillating unit 100, an active element unit 200, first and second capacitor blocks 300 and 400 and a bias current generating unit 500.

In some exemplary embodiments, the oscillating unit 100 may include first and second inductors 110 and 120, and first and second variable capacitors 130 and 140. The first inductor 110 is connected between a power supply voltage VDD and a first output node NO1. The second inductor 120 is connected between the power supply voltage VDD and a second output node NO2. The first variable capacitor 130 is connected between the first output node NO1 and a control node NC. A control voltage VC is applied to the control node NC. The second variable capacitor 140 is connected between the second output node NO2 and the control node NC. The oscillating unit 100 outputs first and second output clock signals OCLK(+) and OCLK(−) at the first and second output nodes NO1 and NO2, respectively. The frequency of the first output clock signal OCLK(+) may be determined by a capacitance of the first variable capacitor 130 responding to the control voltage VC and an inductance of the first inductor 110. Similarly, the frequency of the second output clock signal OCLK(−) may be determined by a capacitance of the second variable capacitor 140 responding to the control voltage VC and an inductance of the second inductor 120. In some exemplary embodiments, the first and second output clock signals OCLK(+) and OCLK(−) may have opposite phases with respect to each other. In some exemplary embodiments, the first and second variable capacitors 130 and 140 may be implemented with varactors.

In some exemplary embodiments, the active element unit 200 may include a first n-type metal-oxide semiconductor (NMOS) transistor 210 and a second NMOS transistor 220. The first NMOS transistor 210 is connected between the first output node NO1 and a bias node NB, and the second NMOS transistor 220 is connected between the second output node NO2 and the bias node NB. In some exemplary embodiments, the first and second NMOS transistors 210 and 220 are cross-coupled with respect to each other. Specifically, the drain of the first NMOS transistor 210 and the gate of the second NMOS transistor 220 are connected to each other to form the first output node NO1. Similarly, the drain of the second NMOS transistor 220 and the gate of the first NMOS transistor 210 are connected to each other to form the second output node NO2. The magnitude and direction of currents from the drain to the source of each of the first and second NMOS transistors may be controlled by each voltage applied between the gate and drain of each of the first and second NMOS transistors 210 and 220. Each transconductance ($g_m$) of the first and second NMOS transistor 210 and 220 may be determined according to each current flowing through the first and second NMOS transistors 210 and 220. Energy for oscillating may be provided to the oscillating unit 100 according to the determined transconductance. That is, the active element unit 200 may maintain the oscillation of the oscillating unit 100.

The capacitances of the first and second capacitor blocks 300 and 400 are controlled by multi-bit control codes CC input to the capacitor blocks 300 and 400. In some exemplary embodiments, the first and second capacitor blocks 300 and 400 provide the same load capacitances to each of the first and second output nodes NO1 and NO2, respectively, in response to a single multi-bit control code CC applied to both capacitor blocks 300 and 400. The structure and operation of the first and second capacitor blocks 300 and 400 will be described in detail below with reference to FIG. 2.

The bias current generating unit 500 is connected to the active element unit 200 at the bias node NB. The bias current generating unit 500 adaptively adjusts an amount of a bias current IVCO provided to the bias node NB in response to the control code CC, such that symmetric currents flow in the active element unit 200. The bias current generating unit 500 adaptively adjusts the amount of a bias current IVCO according to the load capacitances at the first and second output nodes NO1 and NO2, which are provided from the first and second capacitor blocks 300 and 400 in response to the control code CC, such that the oscillation of the oscillating unit 100 may be maintained.

Figure 2:
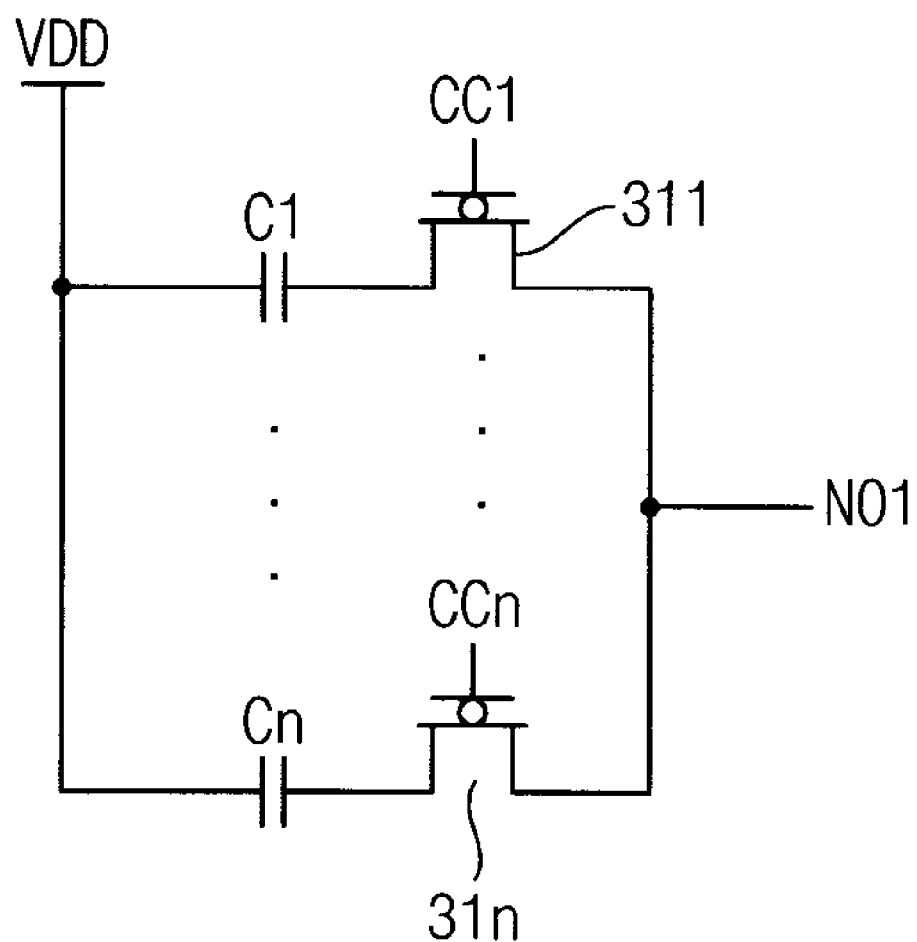
FIG. 2 is a schematic circuit diagram illustrating an example of the first capacitor block in FIG. 1, according to some exemplary embodiments.

FIG. 2 is a schematic circuit diagram illustrating an example of the first capacitor block in FIG. 1, according to some exemplary embodiments. The second capacitor block 400 may have same circuit configuration as the first capacitor block 300.

Referring to FIG. 2, in some exemplary embodiments, the first capacitor block 300 may include a plurality of capacitors C1~Cn, each connected to the power supply voltage VDD in parallel with respect to each other. A plurality of p-type metal-oxide semiconductor (PMOS) transistors 311~31n are connected between the capacitors C1~Cn, respectively, and the first output node NO1. The bits of the control code CC1~CCn are applied to the gates of the PMOS transistors 311~31n, respectively. Each of the PMOS transistors 311~31n may operate as a switch which is turned on/off in response to its respective bit of the control code CC1~CCn applied to its gate. The load capacitance provided to the first output node NO1 may be determined according to the logic level of each bit of the control code CC1~CCn. For example, when each bit of the control code CC1~CCn has a logic low level, all of the PMOS transistors 311~31n are conducting, and, as a result, all of the capacitors C1~Cn are connected in parallel to the output node NO1. Therefore, in this case, the load capacitance provided to the first output node NO1 may be greatest. In addition, in some exemplary embodiments, each capacitance of the capacitors C1~Cn may be same or may have weighted value. That is, in some exemplary embodiments, the size of the capacitors C1~Cn may be same. In addition, in some exemplary embodiments, the size of the capacitors C2~Cn may correspond to increasing multiple of two of the size of the capacitor C1. That is, the capacitances of the capacitors C1~Cn may have a binary increasing relationship, which allows for the setting of any possible capacitance value at the output node NO1, depending on the value of the control code CC.

For example, when it is desired to decrease the frequency of the output clock signal OCNK of the VCO 10, the load capacitance is increased. Therefore, each bit of the control code CC1~CCn may have a logic low level. In this case, the magnitude of the bias current IVCO provided from the bias current generating unit 500 may be greatest in response to the control code CC. Similarly, when it is desired to increase the frequency of the output clock signal OCNK of the VCO 10, the load capacitance is decreased. Therefore, each bit of the control code CC1~CCn may have a logic high level. In this case, the magnitude of the bias current IVCO provided from the bias current generating unit 500 may be smallest in response to the control code CC.

Further, in some exemplary embodiments, the VCO 10 provides both coarse tuning and fine tuning of the frequency of the output clock signal OCLK. That is, the VCO 10 coarsely tunes the frequency of the output clock signal OCLK by determining the load capacitances of the first and second capacitor blocks 300 and 400 in response to the control code CC, and finely tunes the frequency of the output clock signal OCLK by determining the capacitances of the first and second variable capacitors 130 and 140 in the oscillating unit 100, in response to the control voltage VC.

Figure 3:
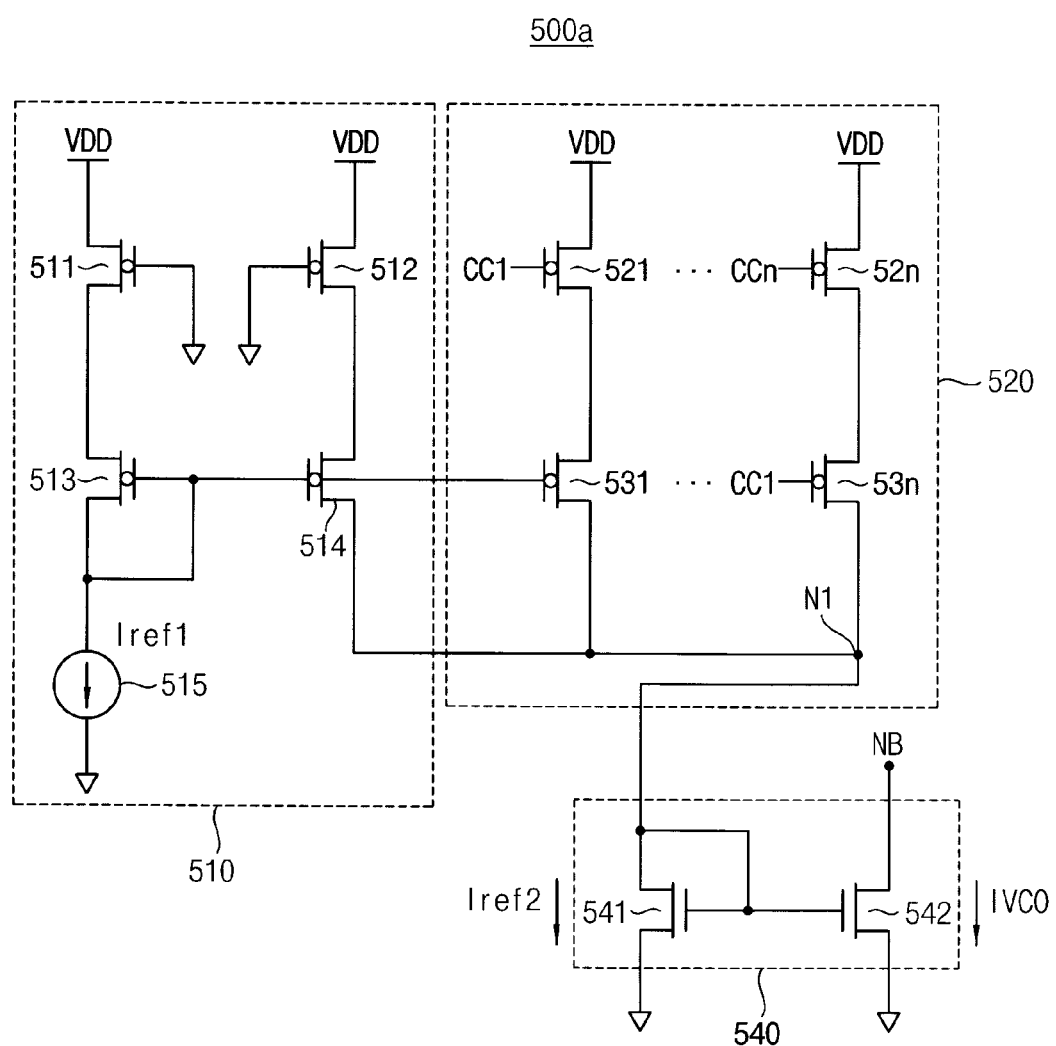
FIG. 3 is a schematic circuit diagram illustrating an example of the bias current generating unit in FIG. 1, according to some exemplary embodiments.

FIG. 3 is a schematic circuit diagram illustrating an example of the bias current generating unit in FIG. 1, according to some exemplary embodiments. Referring to FIG. 3, in some exemplary embodiments, the bias current generating unit 500a may include a first reference current generating unit 510, a second reference current generating unit 520 and a bias current providing unit 540.

The first reference current generating unit 510 includes PMOS transistors 511~514 and a current source 515. Sources of the PMOS transistors 511 and 512 are connected to the power supply voltage VDD, and gates of the PMOS transistors 511 and 512 are connected to the ground voltage. Therefore, the PMOS transistors 511 and 512 are always conducting, and, therefore, sources of the PMOS transistors 513 and 514 are substantially connected to the power supply voltage VDD. The drain of the PMOS transistor 513 is connected to the current source 515, and the PMOS transistors 513 and 514 form a current mirror. Therefore, a first reference current Iref1 flows at the drain of the PMOS transistor 514.

The second reference current generating unit 520 includes a plurality of PMOS transistors 521~52n, which are connected to the power supply voltage VDD in parallel with respect to each other. A plurality of PMOS transistors 531~53n, are connected between the PMOS transistors 521~52n, respectively, and a first node N1. Each of the PMOS transistors 531~53n and the PMOS transistor 514 forms a current mirror. The size of each of the PMOS transistors 531~53n may be same as the size of the PMOS transistor 513. In addition, the size of each of the PMOS transistors 531~53n may correspond to weighted two-multiple of the size of the PMOS transistor 513. Each of the PMOS transistors 521~52n may operate as a switch which is turned on/off in response to a respective bit of the control code CC1~CCn. As a result, the magnitude of a second reference current Iref2 provided from the second reference current generating unit 520 to the bias current providing unit 540 may be determined according to the logic level of each bit of the control code CC1~CCn. For example, when each bit of the control code CC1~CCn has a logic high level, the magnitude of the second reference current Iref2 may be the same as the magnitude of the first reference current Iref1. For example, when each bit of the control code CC1~CCn has a logic low level, the magnitude of the second reference current Iref2 may be (n+1) times as great as the magnitude of the first reference current Iref1. Here, n may be a natural number equal to or greater than two.

In some exemplary embodiments, the size of the PMOS transistor 514 is m times as great as the size of the PMOS transistor 513. In addition, the size of each PMOS transistors 531~53n may be same as the size of the PMOS transistor 513. In this case, the magnitude of the second reference current Iref2 may be m*(n+1) times as great as the magnitude of the first reference current Iref1. In some exemplary embodiments, m may be a natural number equal to or greater than two.

In some exemplary embodiments, the bias current providing unit 540 is connected to the second reference current generating unit 520 at a node N1. The bias current providing unit 540 may include NMOS transistors 541 and 542. The NMOS transistor 541 is connected between the node N1 and a ground voltage, and the NMOS transistor 542 is connected between the bias node NB and the ground voltage. The NMOS transistors 541 and 542 form a current mirror, and the bias current providing unit 540 may provide the bias node NB with a bias current IVCO having the same magnitude as the first reference current Iref1. For example, when each bit of the control code CC1~CCn has a logic high level, the bias current IVCO may have the same magnitude as the first reference current Iref1. In addition, for example, when each bit of the control code CC1~CCn has a logic low level, the magnitude of the bias current IVCO may be (n+1) times as great as the first reference current Iref1.

Accordingly, in accordance with exemplary embodiments of the inventive concept, the bias current generating unit 500a may provide the bias node NB with the bias current IVCO, which has a magnitude adaptively determined according to the load capacitance, which is determined in response to the control code CC1~CCN.

Figure 4:
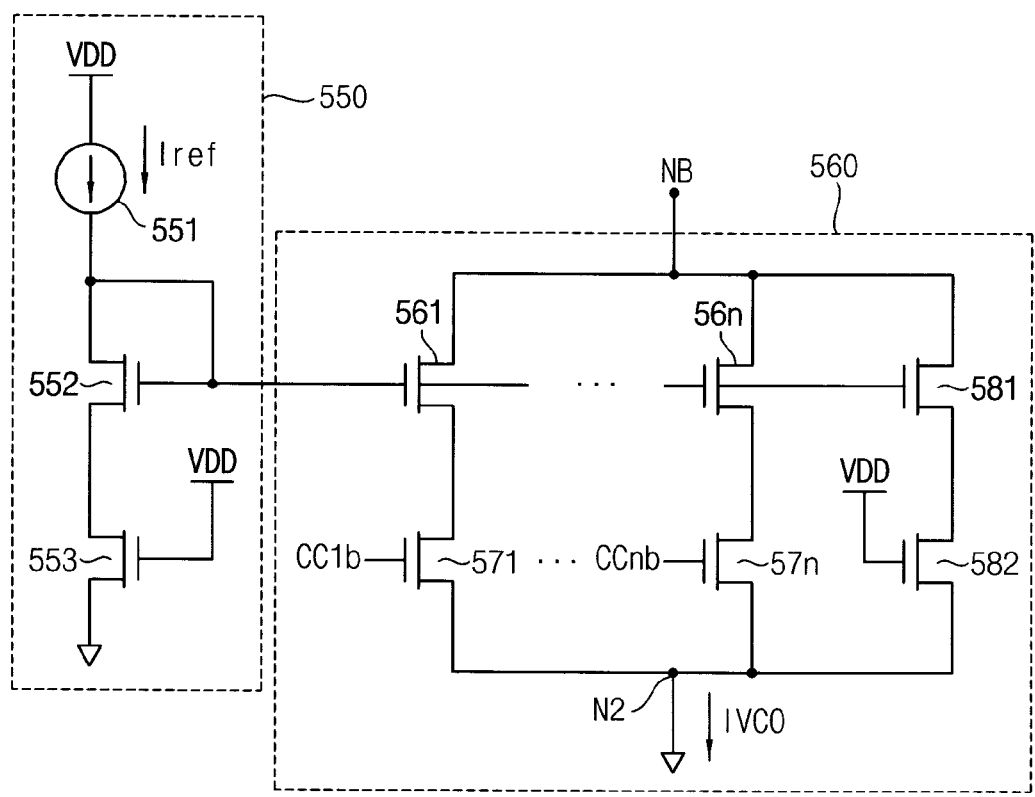
FIG. 4 is a schematic circuit diagram illustrating an example of the bias current generating unit in FIG. 1, according to some exemplary embodiments.

FIG. 4 is a schematic circuit diagram illustrating another example of the bias current generating unit in FIG. 1, according to some exemplary embodiments. Referring to FIG. 4, the bias current generating unit 500b includes a reference current generating unit 550 and a bias current providing unit 560. In some exemplary embodiments, the reference current generating unit 550 may include a current source 551 and NMOS transistors 552 and 553. The current source 551 is connected to the power supply voltage VDD, the NMOS transistor 552 is connected between the current source 551 and the NMOS transistor 553, and the NMOS transistor 553 is connected between the NMOS transistor 552 and the ground voltage. The drain and the gate of the NMOS transistor 552 are connected to each other, and the power supply voltage VDD is connected to the gate of the NMOS transistor 553. As a result, the NOS transistor 553 is always conducting, and, therefore, the source of the NMOS transistor 552 is substantially connected to the ground voltage.

In some exemplary embodiments, the bias current providing unit 560 includes a plurality of NMOS transistors 561~56n and 581, which are connected to the bias node NB in parallel with respect to each other. A plurality of NMOS transistors 571~57n and 582 are connected between the NMOS transistors 561~56n and 581, respectively, and a second node N2. Each of the NMOS transistors 571~57n and 582 and the NMOS transistor 552 forms a current mirror. As a result, each current flowing through each of the NMOS transistors 561~56n and 581 has the same magnitude as a bias current Iref generated in the current source 551. The size of each of the NMOS transistors 561~56n and 581 may be the same as the size of the NMOS transistor 552. In addition, the size of the NMOS transistor 581 may be the same as the size of the NMOS transistor 552, and the size of each of the NMOS transistors 561~56n and 581 may correspond to weighted two-multiples of the size of the NMOS transistor 581.

Each bit of the inverted control code CC1b~CCnb is applied to a respective gate of the NMOS transistors 571~57n. The power supply voltage VDD is connected to the gate of the NMOS transistor 582. As a result, the NMOS transistor 582 is always conducting. Each of the NMOS transistors 571~57n may operate as a switch which is turned on/off in response to a respective bit of the inverted control code CC1b~CCnb. Therefore, the magnitude of the bias current IVCO provided to the bias node NB may be determined by the logic levels of the bits of the control code CC1~CCn. For example, when each bit of the control code CC1~CCn has a logic high level and the size of each of the NMOS transistors 561~56n and 581 is the same as the size of the NMOS transistor 552, the magnitude of the bias current IVCO may be the same as the magnitude of the reference current Iref. For example, when each bit of the control code CC1~CCn has a logic low level and the size of each of the NMOS transistors 561~56n and 581 is the same as the size of the NMOS transistor 552, the magnitude of the bias current IVCO may be (n+1) times as great as the magnitude of the reference current Iref.

Accordingly, the bias current generating unit 500b may provide the bias current IVCO to the bias node NB. The bias current may have a magnitude adaptively determined according to the load capacitance, which is determined in response to the control code CC1~CCN.

Figure 5:
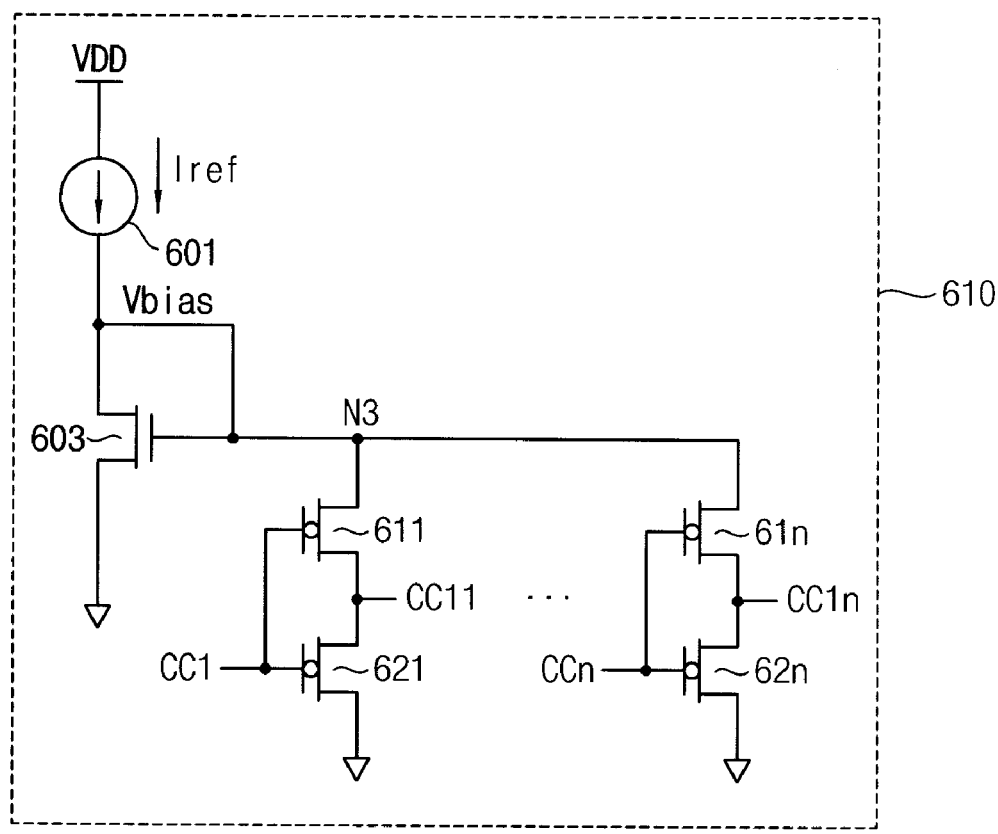
FIG. 5 is a schematic circuit diagram illustrating an example of the bias current generating unit in FIG. 1, according to some exemplary embodiments.
Figure 5:
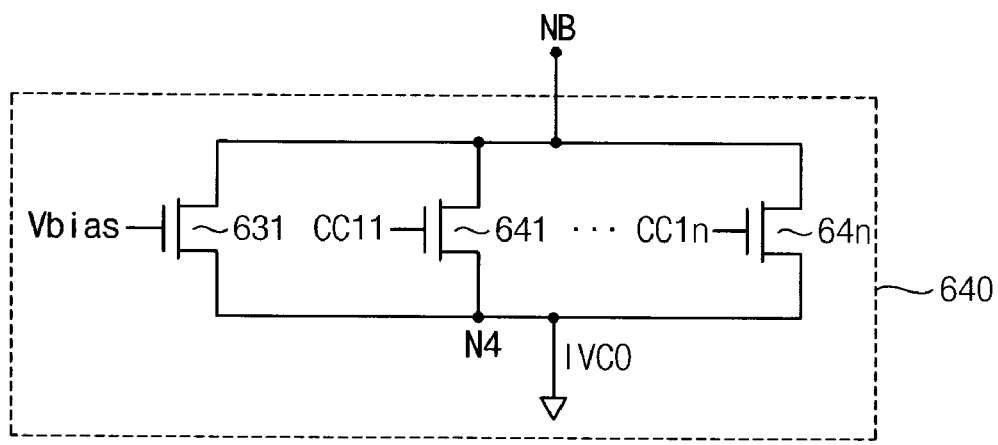

FIG. 5 is a schematic circuit diagram illustrating another example of the bias current generating unit in FIG. 1, according to some exemplary embodiments. Referring to FIG. 5, the bias current generating unit 500c includes an inverted control code generating unit 610 and a bias current providing unit 640.

In some exemplary embodiments, the inverted control code generating unit 610 may includes a current source 601, an NMOS transistor 603, a plurality of PMOS transistors 611~61n and a plurality of NMOS transistors 621~62n. The current source 601 is connected to the power supply voltage VDD and provides a reference current Iref. The NMOS transistor 603 is connected between the current source 601 and the ground voltage. The drain and the gate of the NMOS transistor 603 are connected to each other. The gate of the NMOS transistor 603 is connected to a third node N3. The PMOS transistors 611~61n are also connected to the third node N3. A bias voltage Vbias is applied to the third node N3 due to the reference current Iref. The NMOS transistor 603 is always conducting in response to the bias voltage Vbias.

The NMOS transistors 621~62n are connected between the PMOS transistors 611~61n, respectively, and the ground voltage. Each transistor pair, including one of PMOS transistors 611~61n and a respective one of NMOS transistors 621~62n, forms an inverter. The bits of the control code CC1~CCn are applied to the gates of the PMOS transistors 611~61n, respectively, and the gates of the NMOS transistors 621~62n, respectively. Therefore, the output of each inverter corresponds to an inverted version a respective bit of the control code CC1~CCn. Accordingly, the inverted control code generating unit 610 may generate a multi-bit inverted control code CC1~CCn. Since the bias voltage Vbias is connected to the third node N3, when one bit of the control code CC1~CCn is a logic high level, the corresponding bit of the inverted control code CC11~CC1n is a logic low level. In addition, when one bit of the control code CC1~CCn is a low level, the corresponding bit of the inverted control code CC11~CC1n is a bias voltage level Vbias instead of the power supply voltage VDD.

The bias current providing unit 640 includes a plurality of NMOS transistors 631 and 641~64n connected in parallel between the bias node NB and a fourth node N4. The bias voltage Vbias is applied to the gate of the NMOS transistor 631. In some exemplary embodiments, the size of each of the NMOS transistors 641~64n may be same as the size of the NMOS transistor 631. In addition, in some exemplary embodiments, the size of each of the NMOS transistors 641~64n may correspond to a weighted two-multiple of the size of the NMOS transistor 631.

The bias voltage Vbias is applied to the gate of the NMOS transistor 631. The bits of the inverted control codes CC11~CC1n are applied to the gates of the NMOS transistors 641~64n, respectively. Therefore, a voltage of the logic low level or the bias voltage Vbias is applied to each gate of the NMOS transistors 641~64n according to the logic level of the bits of the inverted control codes CC11~CC1n, respectively. Accordingly, the bias current providing unit 640 may determine the magnitude of the bias current IVCO provided to the bias node NB according to the logic levels of the bits of the control codes CC1~CCn. For example, when each bit of the control codes CC1~CCn has the logic high level and the size of each of the NMOS transistors 641~64n is same as the size of the NMOS transistor 631, each bit of the inverted control codes CC11~CC1n has logic low level, and thus, the bias current IVCO may have same magnitude as the reference current Iref. For example, when each bit of the control codes CC1~CCn has logic low level and each bit of the inverted control codes CC11~CC1n has logic low level, each bit of the inverted control codes CC11~CC1n has the level of the bias voltage Vbias, and thus, the bias current IVCO may have magnitude (n+1) times as large as the reference current Iref.

Therefore, the bias current generating unit 500c may provide the bias node NB with the bias current IVCO. The magnitude of the bias current IVCO is adaptively determined by the load capacitance based on the control code CC1~CCn. That is, the VCO according to exemplary embodiments may provide the same control code to the first and second capacitor blocks 300 and 400 and the bias current generating unit 500 and may adaptively adjust the magnitude of the bias current, which is symmetrically provided to the active element unit 200 according to the load capacitance, which is provided from the first and second capacitor blocks 300 and 400, i.e., according to a frequency of the output frequency signal OCLK.

Figure 6:
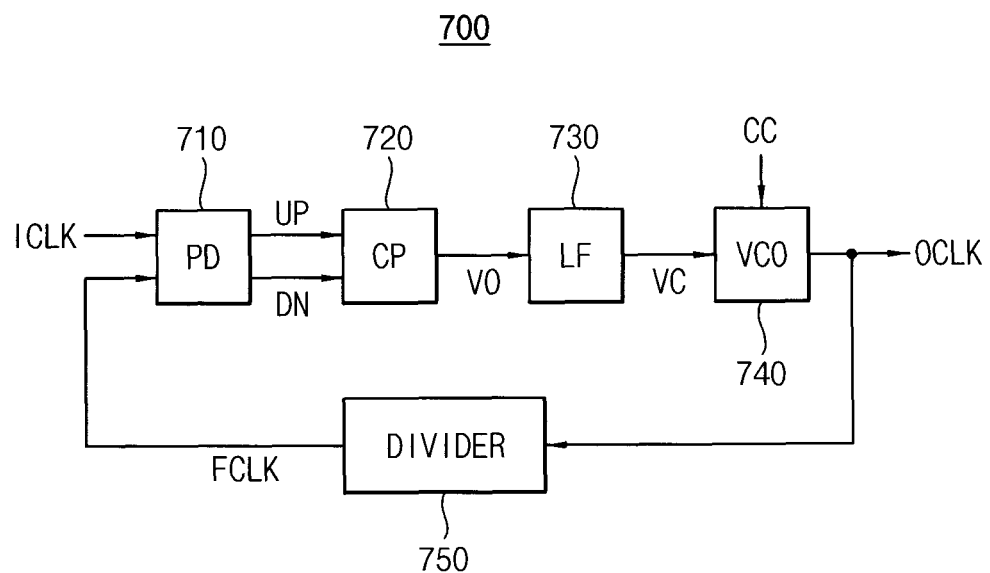
FIG. 6 is a schematic block diagram illustrating a phase-locked loop (PLL) circuit, according to some exemplary embodiments.

FIG. 6 is a schematic block diagram illustrating a phase-locked loop (PLL) circuit according to some exemplary embodiments of the inventive concept. Referring to FIG. 6, a PLL circuit 700 includes a phase detector 710, a charge pump 720, a loop filter 730, a VCO 740 and a divider 750. The PLL circuit 700 generates a feedback clock signal FCLK.

The phase detector 710 detects a phase difference between the input clock signal ICLK and the feedback clock signal FCLK to generate up and down signals UP and DN. The phase detector 710 generates the up signal UP when the input clock signal ICLK leads the feedback clock signal FCLK. The phase detector 710 generates the down signal DN when the input clock signal ICLK lags the feedback clock signal FCLK. In some exemplary embodiments, the phase detector 710 may be implemented with, for example, an XOR gate or a flip-flop.

The charge pump 720 raises the level of an output voltage V0 in response to the up signal UP. The charge pump 720 lowers the level of the output voltage V0 in response to the down signal DN. The loop filter 730 low-pass filters the output voltage V0 to generate a control voltage VC, which is DC voltage. The VCO 740 adjusts the frequency of the output clock signal OCLK in response to the control voltage VC and the control code CC, in accordance with any of the various exemplary embodiments of the inventive concept described in detail above. The VCO 740 may coarsely tune the frequency of the output clock signal OCLK in response to the control code CC and then finely tune the frequency of the output clock signal OCLK in response to the control voltage VC. The VCO 740 may be or may include, for example, the VCO 10 illustrated in FIG. 1 and described in detail above.

The divider 750 divides the frequency of the output clock signal OCLK to provide the feedback clock signal FCLK.

Figure 7:
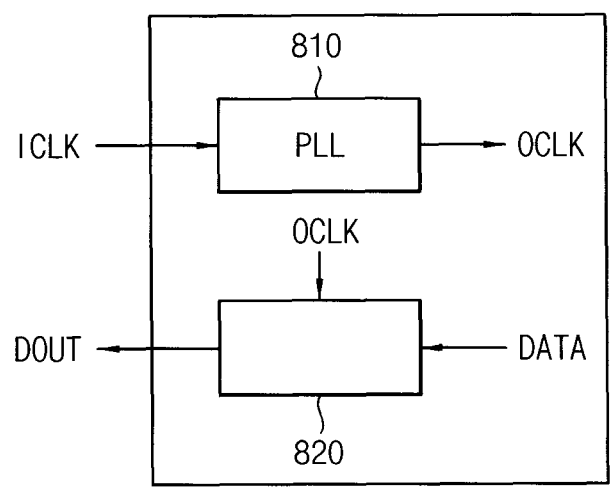
FIG. 7 is a schematic block diagram illustrating a semiconductor memory device, according to some exemplary embodiments.

FIG. 7 is a schematic block diagram illustrating a semiconductor memory device according to some exemplary embodiments of the inventive concept. Referring to FIG. 7, the semiconductor memory device 800 includes a PLL circuit 810 and a data output buffer 820. The semiconductor memory device 800 may be, for example, a DDR SDRAM or a GDDR SDRAM. The PLL circuit 810 may be, e.g., the phase locked loop circuit 700 depicted in FIG. 6. The PLL circuit 810 may generate an output clock signal OCLK. The data output buffer 820 may output internal output data DATA as output data DOUT in response to the output clock signal OCLK. The output data DOUT may be output as being synchronized with the input clock signal ICLK and may be provided to an external device, e.g., a memory controller. The internal output data DATA may be output from, for example, a memory cell array included in the semiconductor memory device 800. The PLL circuit 810 may reduce current consumption by including the VCO which adaptively adjusts the bias current according to the frequency of the output clock signal OCLK, as described above in detail in connection with the various exemplary embodiments.

Figure 8:
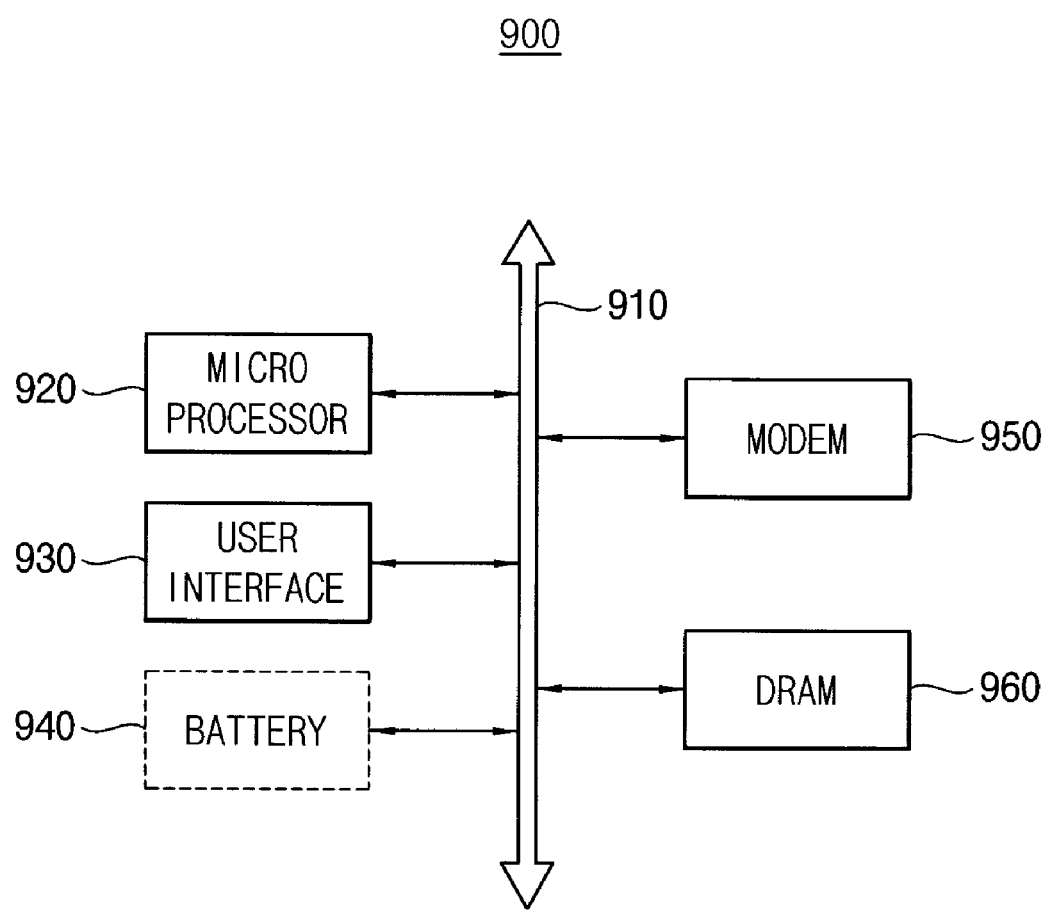
FIG. 8 is a schematic block diagram illustrating an application system including the semiconductor memory device according to some exemplary embodiments.

FIG. 8 is a schematic block diagram illustrating a system in which the semiconductor memory device according to some exemplary embodiments can be applied, according to exemplary embodiments of the inventive concept. Referring to FIG. 8, in some exemplary embodiments, the system 900, which may be, for example, a computing system or a mobile device, includes a microprocessor 920, a user interface 920, a modem 950 such as a baseband chipset and a memory device 960, all of which are connected through a bus 910. In some exemplary embodiments, the memory device 960 may be implemented with, for example, the semiconductor memory device 800 of FIG. 7. The memory device 960 can store data to be processed by the microprocessor 920. When the application system 900 is a mobile device, the application system 900 may further include a battery for providing operating voltage. The application system 900 may further include an application chip set, a camera image processor and a NAND flash memory device. In some exemplary embodiments, the memory device 960 may be included in the application system as a mobile DRAM because the memory device 960 may reduce current consumption by including the VCO, which adaptively adjusts the bias current according to the frequency of the output clock signal OCLK, according to the various exemplary embodiments described in detail above.

The VCO and PLL according to exemplary embodiments may reduce current consumption by adjusting adaptively the bias current according to the frequency of the output clock signal OCLK. Therefore, the VCO and PLL may be widely employed in low-powered memory devices.

The foregoing is illustrative of exemplary embodiments and is not to be construed as limiting thereof. Although some exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims.

What is claimed is:

1. A voltage-controlled oscillator (VCO), comprising:
an oscillating unit configured to output first and second output clock signals at first and second nodes, respectively, the first and second output clock signals having a frequency that is variable in response to a control voltage;

an active element unit connected to the oscillating unit, the active element unit being configured to maintain oscillation of the oscillating unit;

a bias current generating unit connected to the active element unit at a bias node, the bias current generating unit providing a bias current to the bias node and being adapted to adjust the bias current in response to a control code; and first and second capacitor blocks connected to the oscillating unit and the active element unit, the first and second capacitor blocks providing first and second load capacitances, respectively, to the first and second nodes, respectively, in response to the control code.

2. The VCO of claim 1, wherein the first capacitor block comprises:
a plurality of first capacitors connected in parallel to a power supply voltage VDD; and
a plurality of first p-type metal-oxide semiconductor (PMOS) transistors connected respectively between the first capacitors and the first node, and
wherein the second capacitor block comprises:
a plurality of second capacitors connected in parallel to the power supply voltage VDD; and
a plurality of second PMOS transistors connected respectively between the second capacitors and the second node.

3. The VCO of claim 2, wherein bits of the control code are applied respectively to gates of the first PMOS transistors and gates of the second PMOS transistors.

4. The VCO of claim 2, wherein the first and second load capacitances are substantially the same.

5. The VCO of claim 2, wherein:
frequencies of the first and second output clock signals are coarsely tuned based on the first and second load capacitances, the first and second load capacitances being determined by the control code; and
the frequencies of the first and second output clock signals are finely tuned in response to the control voltage.

6. The VCO of claim 1, wherein the bias current generating unit comprises:
a first reference current generating unit which generates a first reference current;
a second reference current generating unit which generates a second reference current, the second reference current having a magnitude which is the same as or n times as great as the magnitude of the first reference current, in response to the control code, wherein n is a natural number equal to or greater than two; and
a bias current providing unit which provides the bias node with the bias current, the bias current having a same magnitude as the second reference current.

7. The VCO of claim 6, wherein the second reference current generating unit comprises:
a plurality of first PMOS transistors, each first PMOS transistor being connected to a power supply voltage; and
a plurality of second PMOS transistors, the second PMOS transistor being connected between respective first PMOS transistors and a first node.

8. The VCO of claim 6, wherein the bias current generating unit comprises:
a first PMOS transistor connected between the first node and a ground voltage, the second reference current flowing through the first PMOS transistor; and
a second PMOS transistor connected between the bias node and the ground voltage, the second PMOS transistor forming a current mirror with the first PMOS transistor.

9. The VCO of claim 1, wherein the bias current generating unit comprises:
a reference current generating unit which generates the reference current; and
a bias current providing unit which provides the bias node with the bias current, the bias current having a magnitude which is the same as or n times as great as the magnitude of the reference current in response to an inverted control code, the inverted control code being an inverted version of the control code, wherein n is a natural number equal to or greater than two.

10. The VCO of claim 9, wherein the reference current generating unit comprises:
a current source connected to a power supply voltage, the current source generating the reference current;
a first n-type MOS (NMOS) transistor connected to the power supply voltage; and
a second NMOS transistor connected to the first NMOS transistor and a ground voltage,
wherein the first NMOS transistor has a gate connected to the current source, and the second NMOS transistor has a gate connected to the power supply voltage.

11. The VCO of claim 1, wherein the bias current generating unit comprises:
an inverted control code generating unit which provides a bias voltage based on a reference current and generates an inverted control code in response to the control code; and
a bias current providing unit which provides the bias node with the bias current having a magnitude which is the same as or n times as great as the magnitude of the reference current in response to the inverted control code, wherein n is a natural number equal to or greater than two.

12. The VCO of claim 11, wherein the inverted control code generating unit comprises:
a current source connected to a power supply voltage, the current source generating the reference current and providing the bias voltage in response to the reference current;
a first NMOS transistor connected to the current source and a ground voltage; and
a plurality of inverters, connected in parallel to a connection node connected to the current source and a gate of the first NMOS transistor, each of the inverters including one of a plurality of PMOS transistors and one of a plurality of first NMOS transistors, and each of the inverters generating one bit of the inverted control code in response to a respective bit of the control code.

13. The VCO of claim 12, wherein each bit of the inverted control code has a level of the bias voltage or the ground voltage in response to the control code.

14. A phase-locked loop (PLL) circuit, comprising:
a phase detector which detects a phase difference between an input clock signal and a feedback clock signal to generate an up signal and a down signal;
a charge pump which controls a level of an output voltage in response to the up signal and the down signal;
a loop filter which low-pass filters the output voltage to generate a control voltage;
a voltage-controlled oscillator (VCO) which adaptively adjusts a frequency of an output clock signal in response to the control voltage and a control code; and a divider which divides the frequency of the output clock signal to provide the feedback clock signal, the VCO comprising:
   an oscillating unit configured to output first and second output clock signals at first and second nodes, respectively, the first and second output clock signals having a frequency that is variable in response to the control voltage;
   an active element unit connected to the oscillating unit, the active element unit being configured to maintain oscillation of the oscillating unit;
   a bias current generating unit connected to the active element unit at a bias node, the bias current generating unit providing a bias current to the bias node and being adapted to adjust the bias current in response to a control code; and
   first and second capacitor blocks connected to the oscillating unit and the active element unit, the first and second capacitor blocks providing first and second load capacitances, respectively, to the first and second nodes, respectively, in response to the control code.

15. The PLL circuit of claim 14, wherein the VCO coarsely tunes the frequency of the output clock signals in response to the control code, and finely tunes the frequency of the output clock signals in response to the control voltage.

16. A semiconductor memory device, comprising:
a phase-locked loop having a voltage-controlled oscillator (VCO), the VCO comprising:
   an oscillating unit configured to output first and second output clock signals at first and second nodes, respectively, the first and second output clock signals having a frequency that is variable in response to the control voltage,
   an active element unit connected to the oscillating unit, the active element unit being configured to maintain oscillation of the oscillating unit,
   a bias current generating unit connected to the active element unit at a bias node, the bias current generating unit providing a bias current to the bias node and being adapted to adjust the bias current in response to a control code, and
   first and second capacitor blocks connected to the oscillating unit and the active element unit, the first and second capacitor blocks providing first and second load capacitances, respectively, to the first and second nodes, respectively, in response to the control code; and
a data output buffer, the data output buffer temporarily storing data in response to the first and second output clock signals.

17. The semiconductor memory device of claim 16, wherein the semiconductor memory device is a DDR SDRAM.

18. The semiconductor memory device of claim 16, wherein the semiconductor memory device is a GDDR SDRAM.

19. The semiconductor memory device of claim 16, wherein the bias current generating unit comprises:
   a reference current generating unit which generates the reference current; and
   a bias current providing unit which provides the bias node with the bias current, the bias current having a magnitude which is the same as or n times as great as the magnitude of the reference current in response to an inverted control code, the inverted control code being an inverted version of the control code, wherein n is a natural number equal to or greater than two.

20. The semiconductor memory device of claim 16, wherein the first capacitor block comprises:
   a plurality of first capacitors connected in parallel to a power supply voltage VDD; and
   a plurality of first p-type metal-oxide semiconductor (PMOS) transistors connected respectively between the first capacitors and the first node, and
wherein the second capacitor block comprises:
   a plurality of second capacitors connected in parallel to the power supply voltage VDD; and
   a plurality of second PMOS transistors connected respectively between the second capacitors and the second node.

* * * * *